(12) United States Patent
Albrecht et al.

(10) Patent No.: US 8,710,512 B2
(45) Date of Patent: Apr. 29, 2014

(54) OPTOELECTRONIC SEMICONDUCTOR CHIP COMPRISING A REFLECTIVE LAYER

(75) Inventors: Tony Albrecht, Bad Abbach (DE);
Andreas Weimar, Regensburg (DE);
Anna Kasprzak-Zablocka, Regensburg (DE); Christian Eichinger, Wenzenbach (DE); Kerstin Neveling, Regensburg (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 12/922,577

(22) PCT Filed: Apr. 24, 2009

(86) PCT No.: PCT/DE2009/000576
§ 371 (c)(1),
(2), (4) Date: Dec. 13, 2010

(87) PCT Pub. No.: WO2009/140939
PCT Pub. Date: Nov. 26, 2009

(65) Prior Publication Data
US 2011/0079810 A1    Apr. 7, 2011

(30) Foreign Application Priority Data
May 20, 2008 (DE) .......................... 10 2008 024 327

(51) Int. Cl.
*H01L 33/42* (2010.01)

(52) U.S. Cl.
USPC .................... 257/79; 257/98; 257/E33.064

(58) Field of Classification Search
USPC ............... 257/E33.065, 98, E33.064
See application file for complete search history.

(56) References Cited

U.S. PATENT DOCUMENTS

| | | | |
|---|---|---|---|
| 5,406,095 A * | 4/1995 | Koyama et al. | 257/88 |
| 6,797,988 B2 * | 9/2004 | Lin et al. | 257/98 |
| 7,265,392 B2 | 9/2007 | Hahn et al. | |
| 2003/0222269 A1 | 12/2003 | Lin et al. | |
| 2004/0099857 A1 * | 5/2004 | Song et al. | 257/12 |
| 2005/0205883 A1 | 9/2005 | Wierer, Jr. et al. | |
| 2007/0290215 A1 * | 12/2007 | Kato et al. | 257/79 |
| 2008/0308832 A1 * | 12/2008 | Hsieh et al. | 257/98 |

FOREIGN PATENT DOCUMENTS

| | | |
|---|---|---|
| DE | 10 2004 040 277 | 2/2006 |
| EP | 1 583 159 | 10/2005 |
| JP | 2004-047504 | 2/2004 |
| JP | 2005-101212 | 4/2005 |

(Continued)

OTHER PUBLICATIONS

Ashida, et al., "Thermal transport properties of polycrystalline tin-doped indium oxide films," J. Appl. Phys. 105, 073709 (2009), DOI:10.1063/1.3093684.*

*Primary Examiner* — Eva Yan Montalvo
*Assistant Examiner* — Christopher Johnson
(74) *Attorney, Agent, or Firm* — Cozen O'Connor

(57) ABSTRACT

An optoelectronic semiconductor chip, comprising a first contact location (1) and a second contact location (2), and a reflective layer (3), which is directly electrically conductively connected to the second contact location. The reflective layer contains a metal that tends toward migration, and the reflective layer is arranged in such a way that a migration path (4) for the metal can form between the second and the first contact location. A means (6) which, during operation of the semiconductor chip, forms an electric field that counteracts the migration of the metal is provided at the semiconductor chip.

14 Claims, 2 Drawing Sheets

(56) References Cited

FOREIGN PATENT DOCUMENTS

| | | |
|---|---|---|
| JP | 2006-245230 | 9/2006 |
| JP | 2007-214302 | 8/2007 |
| JP | 2007-300017 | 11/2007 |
| JP | 2007-335793 | 12/2007 |
| TW | 544953 | 8/2003 |
| TW | 200816519 | 4/2008 |
| WO | WO 2006/043796 | 4/2006 |
| WO | WO 2007/099855 | 9/2007 |
| WO | WO 2008/047923 | 4/2008 |

* cited by examiner

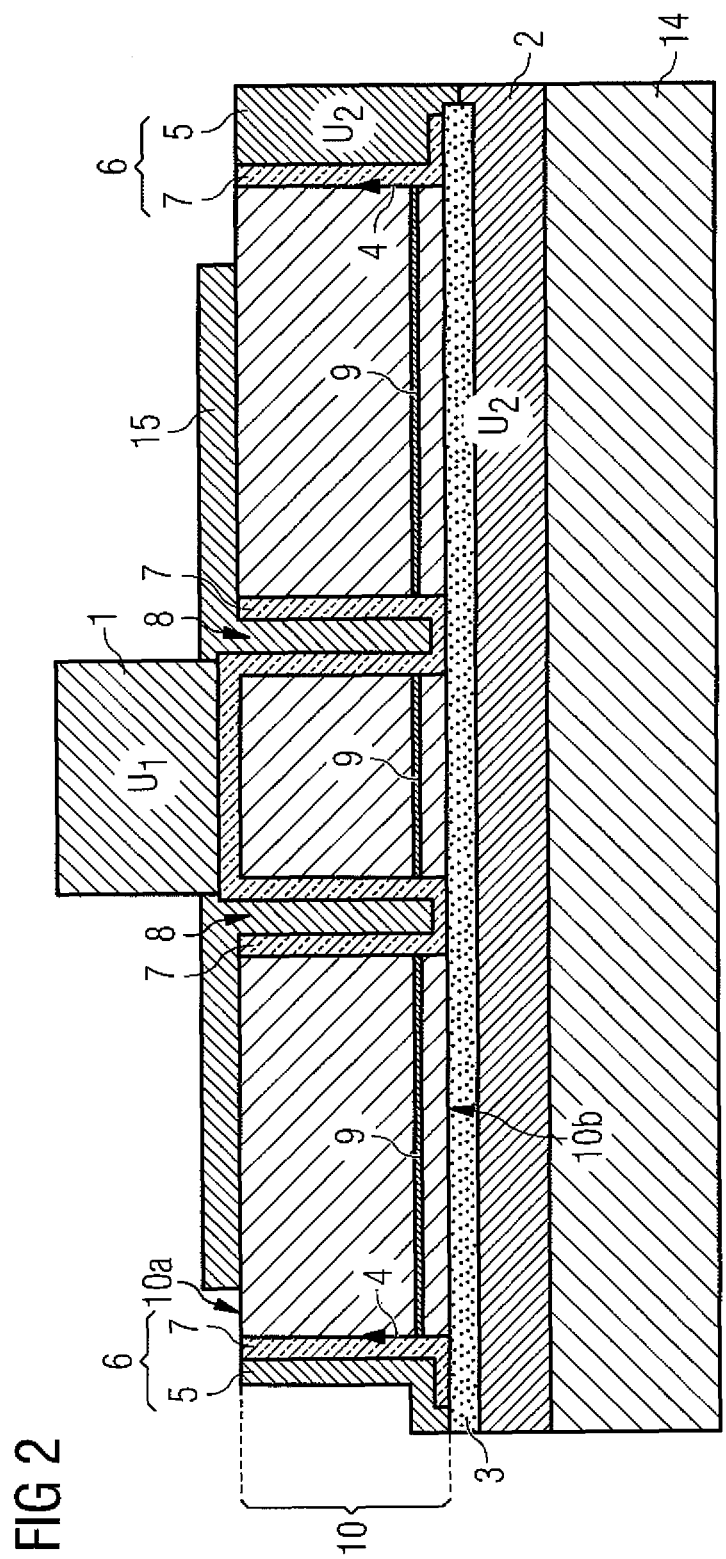

OPTOELECTRONIC SEMICONDUCTOR CHIP COMPRISING A REFLECTIVE LAYER

RELATED APPLICATIONS

This is a U.S. national stage of application No. PCT/DE2009/000576, filed on Apr. 24, 2009.

This application claims the priority of German application no. 10 2008 024 327.2 filed May 20, 2008, the entire content of which is hereby incorporated by reference.

FIELD OF THE INVENTION

The present invention is related to an optoelectronic semiconductor chip.

BACKGROUND OF THE INVETION

The document U.S. Pat. No. 7,265,392 describes an optoelectronic semiconductor chip comprising a silver-containing reflective layer.

SUMMARY OF THE INVENTION

One object of the invention is to provide an optoelectronic semiconductor chip having a particularly long lifetime. A further object is to provide an optoelectronic semiconductor chip which can be produced in a particularly simple manner. A further object is to provide an optoelectronic semiconductor chip which is particularly efficient.

An optoelectronic semiconductor chip is specified. The optoelectronic semiconductor chip is a luminescence diode chip, for example. The luminescence diode chip can be a laser diode chip or preferably a light-emitting diode chip. Furthermore, it is possible for the optoelectronic semiconductor chip to be a detector chip, such as a photodiode chip, for example.

In accordance with at least one embodiment of the optoelectronic semiconductor chip, the latter has a first contact location and a second contact location. An electric current for the operation of the optoelectronic semiconductor chip can be applied to the optoelectronic semiconductor chip via the contact locations. The first contact location is, for example, an n-type contact of the semiconductor chip. The second contact location is then a p-type contact of the semiconductor chip. The first contact location can be formed by a bonding pad, for example. The second contact location can be formed by a solder metallization.

In accordance with at least one embodiment of the optoelectronic semiconductor chip, the optoelectronic semiconductor chip comprises a reflective layer. The reflective layer is provided for reflecting electromagnetic radiation that is generated in the optoelectronic semiconductor chip or is to be detected in the optoelectronic semiconductor chip.

In this case, the reflective layer is preferably directly electrically conductively connected to the second contact location. In this case, "directly electrically conductively" means that, for example, no semiconductor material is situated between the second contact location and the reflective layer, rather the reflective layer and the second contact location are in direct contact with one another or are connected to one another by a material having good conductivity—such as a metal.

The reflective layer can be a mirror. The reflective layer preferably has a reflectivity of at least 80%, preferably of at least 90%, for electromagnetic radiation generated or to be detected in the semiconductor chip.

The reflective layer contains a metal that tends toward migration. "A metal that tends toward migration" means that the metal, in an external electric field, tends toward movement or diffusion that is driven by the external electric field. In other words, on account of the electric field, a force acts on the metal in the reflective layer, which can lead to the extraction of metal from the reflective layer.

By way of example, ions of the metal can move along the field lines and can pass by means of this migration into regions of the optoelectronic semiconductor chip where they cause damage. Furthermore, it is possible for the metal that tends toward migration, on account of the migration movement in the electric field, to pass out of the semiconductor chip into, for example, a housing for the optoelectronic semiconductor chip, where it can likewise cause damage.

The damage caused can consist, for example, in a short circuit of the optoelectronic semiconductor chip. Furthermore, as a result of the migration in the electric field—that is to say the electromigration—out of the reflective layer, the reflective layer is damaged, such that its electrical and optical properties are adversely influenced. In this case, the problem of the tendency toward migration in the electric field also occurs, in particular, in a moist environment. Overall, the migration of the metal from the reflective layer reduces the lifetime of the optoelectronic semiconductor chip.

The metal that tends toward migration is silver, for example. In this case, silver ions then tend toward migration along electric field lines in the optoelectronic semiconductor chip. Furthermore, it is possible for the metal that tends toward migration to be a different metal, such as copper or nickel, for example.

In accordance with at least one embodiment, the reflective layer is arranged in the optoelectronic semiconductor chip in such a way that a migration path for the metal that tends toward migration can form between the second and the first contact location. By way of example, the reflective layer directly adjoins a semiconductor body of the optoelectronic semiconductor chip. First and second contact locations are then electrically conductively connected to the semiconductor body. On account of the electrically conductive connection between the second contact location and the reflective layer, a migration path can then form in the semiconductor body between the first and the second contact location.

The presence of a migration path means, therefore, that the optoelectronic semiconductor chip contains, in particular, no migration blocker or migration barrier that could prevent the metal that tends toward migration from the reflective layer from migration in the optoelectronic semiconductor chip. The optoelectronic semiconductor chip is therefore free of a migration barrier for migration of the metal that tends toward migration from the reflective layer. Dispensing with such a migration barrier results in a optoelectronic semiconductor chip which can be produced in a particularly simple and hence cost-effective manner.

In accordance with at least one embodiment of the optoelectronic semiconductor chip, a means which, during operation of the semiconductor chip, forms an electric field that counteracts the migration of the metal is provided at the semiconductor chip. That is to say that, during operation of the semiconductor chip, firstly an electric field is present between the first and the second contact location, which electric field promotes the electromigration of metal from the reflective layer in the optoelectronic semiconductor chip. The means in the semiconductor chip counteracts said electric field, said means for its part forming an electric field that counteracts the migration of the metal.

In other words, the extraction of the metal from the reflective layer and the migration of the metal in the optoelectronic semiconductor chip are prevented or at least inhibited by virtue of the fact that, in particular, critical locations of the semiconductor chip in which migration of the metal would take place to an intensified extent are shielded by the electric field. That is to say that, in the case of the present optoelectronic semiconductor chip, the reflective layer is not encapsulated with, for example, dielectrics or metallic blockers as migration barriers, rather the migration is prevented by the shielding of the electric field present in the semiconductor chip, or an opposing electric field.

In accordance with at least one embodiment of the optoelectronic semiconductor chip, the optoelectronic semiconductor chip comprises a first and a second contact location and also a reflective layer, which is directly electrically conductively connected to the second contact location, wherein the reflective layer contains a metal that tends toward migration and the reflective layer is arranged in such a way that a migration path for the metal can form between the second and the first contact location. In this case, a means which, during operation of the semiconductor chip, forms an electric field that counteracts the migration of the metal is provided at the semiconductor chip. Said means can be arranged for example marginally at the optoelectronic semiconductor chip. Furthermore, it is possible for said means also to be arranged at least in places in the semiconductor chip.

In accordance with at least one embodiment of the optoelectronic semiconductor chip, the means is formed with an electrically conductive material extending between the first and the second contact location. In this case, the electrically conductive material is directly electrically conductively connected to the second contact location. That is to say that there is a direct electrical linking of the electrically conductive material to the second contact location. The electrically conductive material and the second contact location touch each other, for example, or are connected to each other by a good electrical connection—for example a metallic connection. In this case, the material is arranged at the semiconductor chip in such a way that it extends between the first and the second contact location. That is to say that the material extends at least in places in the direction of the migration path for the metal that tends toward migration from the reflective layer.

In accordance with at least one embodiment of the optoelectronic semiconductor chip, the optoelectronic semiconductor chip comprises a semiconductor body, at whose top side the first contact location is arranged and at whose underside the second contact location is arranged. The optoelectronic semiconductor chip furthermore comprises a reflective layer, which is situated in direct contact with the semiconductor body. By way of example, the reflective layer is applied to the underside of the semiconductor body and directly adjoins the semiconductor body at the underside thereof. In this case, it is possible for the reflective layer to completely cover a bottom area of the semiconductor body. Furthermore, it is possible for the reflective layer to be applied to the bottom area of the semiconductor body in a structured fashion. The reflective layer is situated in direct electrical contact with the second contact location, that is to say that it is directly conductively connected to the second contact location.

By way of example, the second contact location directly adjoins the reflective layer. The reflective layer is then arranged between the second contact location and the semiconductor body. The arrangement of the reflective layer between the second contact location and the semiconductor body and also the direct contact between the reflective layer and the semiconductor body result in a migration path for metal that tends toward migration from the reflective layer into the semiconductor body or at edge areas of the semiconductor body. The migration path runs, for example, between the second contact location and the first contact location, which is arranged at the top side of the semiconductor body.

The optoelectronic semiconductor chip furthermore comprises at least one chip sidewall, which can be formed by a side area of the semiconductor body. In this case, the chip sidewall extends between the top side and the underside of the semiconductor body. The chip sidewall can form an edge area of the semiconductor chip. The electrically conductive material is arranged at the chip sidewall, said material being directly electrically conductively connected to the second contact location. That is to say that the means which forms an electric field during operation of the semiconductor chip is formed with the electrically conductive material situated at the chip sidewall. Since the chip sidewall is arranged between top side and underside of the semiconductor body and the first contact location is arranged at the top side of the semiconductor body and the second contact location is arranged at the underside of the semiconductor body, the electrically conductive material extends at the chip sidewall, that is to say between the first and the second contact location.

In accordance with at least one embodiment of the optoelectronic semiconductor chip, the electrically conductive material is in this case not applied directly to the chip sidewall, rather an electrically insulating material is situated between the chip sidewall and the electrically conductive material, said electrically insulating material preventing contact from being made with the semiconductor body by means of the electrically conductive material. In this case, the means which forms an electric field during operation of the semiconductor chip is formed from the electrically insulating material and the electrically conductive material which is arranged on the electrically insulating material and which is directly electrically conductively connected to the second contact location. In this case, the electrically insulating material ensures that the electrically conductive material, in particular, does not short-circuit an active zone of the optoelectronic semiconductor chip that is provided for generating radiation or detecting radiation.

In accordance with at least one embodiment of the optoelectronic semiconductor chip, during operation of the semiconductor chip the first contact location is at a first electrical potential. This can be achieved, for example, by virtue of the first electrical contact location forming the n-side contact of the semiconductor body. The first contact location is then connected to the negative pole of a voltage source.

Furthermore, the second contact location, the reflective layer and also the electrically conductive material are at a common second electrical potential. This is achieved by virtue of both the reflective layer and the electrically conductive material being directly electrically conductively connected to the second contact location. The second contact location can then be connected to the positive pole of the voltage source, for example.

In this way, the first electrical contact location, on the one hand, and the second contact location, the reflective layer and the electrically conductive material, on the other hand, are at two mutually different first and second electrical potentials. On account of the arrangement of the electrically conductive material between the first and second contact locations and the fact that the electrically conductive material is at a common electrical potential with the reflective layer and the second contact location, the electrically conductive material acts as a means which, during operation of the semiconductor body, forms an electric field that counteracts the migration of the metal from the reflective layer, that is to say the electric field formed between the first and second contact locations.

The electrically conductive material therefore lies between the reflective layer and the first contact and shields the electric field in the region of the reflective layer, such that, by way of example, metal ions from the reflective layer are not drawn toward the first contact location.

In accordance with at least one embodiment of the optoelectronic semiconductor chip, in this case the reflective layer contains silver or it consists of silver. Silver is distinguished by the fact that it has a high reflectivity over a large range of the spectrum for visible light. Furthermore, silver is distinguished by a very good electrical conductivity, such that it can be used as an electrical contact. Silver has, however, particularly in the form of silver ions, a high tendency toward migration in the electric field, which usually makes it more difficult or impossible to use silver as a reflective layer in an optoelectronic semiconductor chip.

In accordance with at least one embodiment of the optoelectronic semiconductor chip, the reflective layer is structured in such a way that, at the underside of the semiconductor body, the semiconductor body is free of the reflective layer in the region of the projection of the first contact location onto said underside. In this region, by way of example, an electrically insulating material can be arranged between the second contact location and the semiconductor body, said electrically insulating material preventing energization of the semiconductor body in this region. This has the advantage that, in the region of the first contact location, no electric current can flow into an active zone of the semiconductor body that is provided for radiation generation or detection, such that no radiation is generated below the first contact location. This is because said radiation would be absorbed at the first contact location and therefore could not contribute to the light generation or light detection. That is to say that where the first contact location is situated, no electromagnetic radiation is generated in the active zone.

In accordance with at least one embodiment of the optoelectronic semiconductor chip, a trench is structured into the semiconductor body around the first contact location from the top side of the semiconductor body. Said trench can be structured by means of etching, for example. It preferably completely encloses the first contact location, which is arranged, for example, at a central location at the top side of the semiconductor body. In other words, the trench runs around the first contact location in a ring-like manner, for example. In this case, the trench preferably severs the active zone. Particularly preferably, the trench extends as far as the reflective layer. That is to say that the trench can be formed with a depth such that it completely severs the semiconductor body from its top side as far as its underside. A trench of such depth constitutes a particularly effective possibility for preventing energization of the active zone below the first semiconductor layer.

In accordance with at least one embodiment of the optoelectronic semiconductor chip, the latter is embodied in thin-film design, that is to say that the optoelectronic semiconductor chip comprises a semiconductor body that is preferably grown epitaxially onto a growth substrate. After the epitaxial growth of the semiconductor body, the growth substrate is preferably thinned, that is to say reduced in its thickness, or completely removed from the semiconductor body. By its side remote from the original growth substrate, the semiconductor body can be fixed on a carrier.

Preferably, the reflective layer is situated between the carrier and the semiconductor body.

The sequence can be as follows, for example: onto a mounting side of the carrier there follows the second contact location, which can be formed by a solder metallization, for example. The second contact location is then followed directly by the reflective layer, that is to say that the reflective layer is situated in direct contact with the second contact location. The reflective layer is then preferably followed by the semiconductor body at its side remote from the second contact location. Semiconductor body and reflective layer are preferably situated in direct contact with one another. A migration blocker or a migration barrier that prevents the migration of metals or metal ions from the carrier, the second contact location and/or the reflective layer into the semiconductor body can be dispensed with on account of the means for shielding the electric field between the first and second contact locations.

BRIEF DESCRIPTION OF THE DRAWINGS

FIG. 2 shows, on the basis of a schematic sectional illustration, a second exemplary embodiment of an optoelectronic semiconductor chip described here comprising a reflective layer.

DETAILED DESCRIPTION OF THE DRAWINGS

Figure 1:
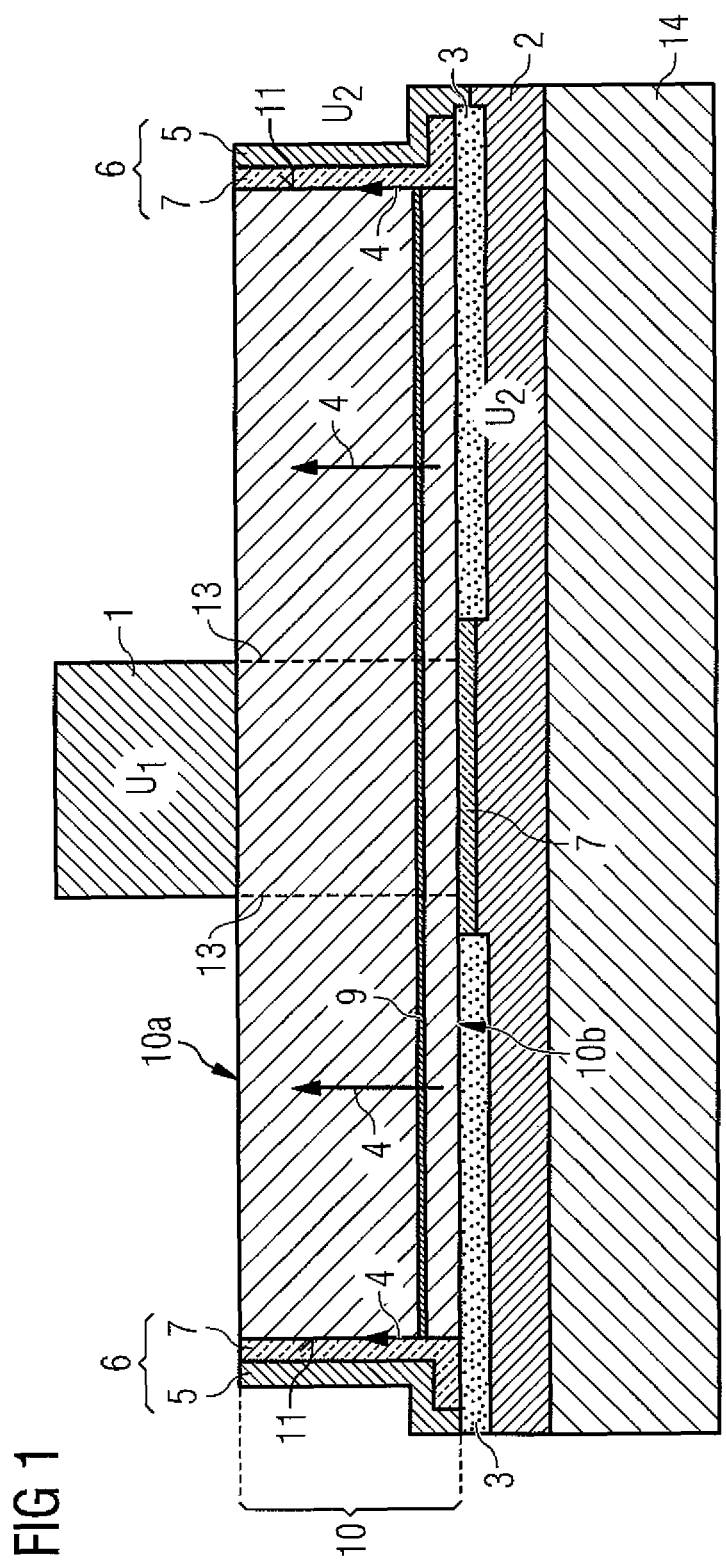
FIG. 1 shows, on the basis of a schematic sectional illustration, a first exemplary embodiment of an optoelectronic semiconductor chip described here comprising a reflective layer.

Elements which are identical, of identical type or act identically are provided with the same reference symbols in the figures. The figures and the size relationships of the elements illustrated in the figures among one another should not be regarded as to scale. Rather, individual elements may be illustrated with an exaggerated size in order to allow better illustration and/or in order to afford a better understanding.

The optoelectronic semiconductor chip described in conjunction with FIG. 1 is, for example, a light-emitting diode chip that generates electromagnetic radiation in the visible wavelength range during operation. The optoelectronic semiconductor chip comprises a semiconductor body 10. The semiconductor body 10 is preferably produced epitaxially. By way of example, a growth substrate (not illustrated in FIG. 1) is stripped away from the top side 10a of the semiconductor body 10. At its underside 10b remote from the top side 10a, the semiconductor body 10 is applied to a carrier 14. The semiconductor body 10 is based on a nitride compound semiconductor material, for example. The carrier 14 contains or consists of germanium.

In the present connection, "based on nitride compound semiconductor material" means that the semiconductor layer sequence or at least one part thereof, particularly preferably at least the active zone, comprises or consists of a nitride compound semiconductor material, preferably $Al_nGa_mIn_{1-n-m}N$, where $0 \leq n \leq 1$, $0 \leq m \leq 1$ and $n+m \leq 1$. In this case, this material need not necessarily have a mathematically exact composition according to the above formula. Rather, it can comprise, for example, one or a plurality of dopants and additional constituents. For the sake of simplicity, however, the above formula includes only the essential constituents of the crystal lattice (Al, Ga, In, N), even if these can be replaced and/or supplemented in part by small amounts of further substances.

The semiconductor body 10 comprises an active zone 9, which is suitable for generating electromagnetic radiation in the case of the present optoelectronic semiconductor chip. The active zone 9 comprises a pn junction, a double heterostructure, a single quantum well and/or a multiple quantum well for generating radiation. In this case, the designation quantum well structure does not include any indication about the dimensionality of the quantization. It therefore encompasses, inter alia, quantum wells, quantum wires and quantum dots and any combination of these structures.

The optoelectronic semiconductor chip comprises a first electrical contact location 1 at its top side 10*a*. The first electrical contact location 1 is, for example, a bonding pad for the n-side contact-connection of the optoelectronic semiconductor chip. The first contact location can, for example, contain gold and/or aluminum, or consist of one of these materials. Furthermore, it is possible for the first contact location to consist of at least one of the following metals, or to contain at least one of the following metals: titanium, platinum, chromium, nickel. The first contact location can consist, for example, of the following material combinations: TiPtAu, CrPtAu, NiAu. In this case, it is possible for the different metals to be arranged one above another in layers.

At the underside 10*b* of the semiconductor body, a mirror layer 3 is situated in direct contact with the semiconductor body 10. The reflective layer 3 contains a metal that tends toward migration. In this case, the reflective layer 3 can contain one of the following metals or consist of one of the following metals: aluminum, platinum, silver. Particularly preferably, the reflective layer 3 consists of silver. The reflective layer 3 directly adjoins the semiconductor body 10. That is to say that, between reflective layer 3 and semiconductor body 10, by way of example, no migration barrier is situated there, that is to say that no layer consisting of TiWN, for example, is situated there.

The second contact location 2 of the optoelectronic semiconductor chip is situated at that side of the reflective layer 3 which is remote from the semiconductor body 10. The second contact location 2 of the optoelectronic semiconductor chip is formed by a solder metallization, for example. Materials for the second contact location 2 can be, for instance, solder connections formed with tin or with indium. By way of example, the second contact location 2 is an AuSn solder connection.

The second contact location 2 is situated in direct contact with the reflective layer 3. The reflective layer 3 is interrupted in the projection 13 of the first contact location 1 onto the underside 10*b* of the semiconductor body 10. That is to say that the reflective layer 3 is structured. The reflective layer 3 does not completely cover the semiconductor body 10 at the underside 10*b* thereof. An electrically insulating layer 7 is situated in the region of the projection 13 of the first contact location 1 onto the underside 10*b* of the semiconductor body 10.

A dielectric is preferably used for forming the electrically insulating layer. By way of example, the insulating layer can contain at least one of the following materials: $SiN_x$, $SiO_2$, $TiO$, $Al_2O_3$.

On account of the insulating layer 7 below the first contact location 1, in the region of the projection 13 onto the active zone 9, no electromagnetic radiation is generated there. This increases the efficiency of the optoelectronic semiconductor chip since electromagnetic radiation generated in this region could not leave the semiconductor body at the top side thereof since it is absorbed by the first contact location 1.

During operation of the optoelectronic semiconductor chip, the first contact location 1 is at a first electrical potential U1 and is connected to the negative pole of a voltage source, for example. The second contact location 2 is at a different potential U2 and is connected to the positive pole of the voltage source, for example. The second contact location 2 is situated in direct electrical contact with the reflective layer 3, which consists of an electrically conductive material. The reflective layer 3 is therefore likewise at the potential U2. The potential difference between U1 and U2 results in an electric field, which exerts a force for example on positively charged metal ions, preferably silver ions, from the reflective layer 3, said force being directed from the underside 10*b* to the top side 10*a* of the semiconductor body 10. In the electric field formed in this way, the metal ions have a tendency toward migration along the migration paths 4.

The migration could be effected by way of example through the semiconductor body 10, for example along dislocations in the semiconductor body 10.

The majority of the migration would—without countermeasures—however be effected along migration paths 4 extending along the chip sidewalls 11. That is to say that the metal that tends toward migration—for example silver—migrates to or via the chip sidewalls 11. The metal moves there along field lines of the electric field described above. Said field lines can also be formed in a semicircular fashion at the chip sidewalls—in a manner similar to that in the case of a plate capacitor. Primarily the migration along the chip sidewalls is prevented particularly effectively in the present case.

Without measures against this migration, which occurs to an intensified extent primarily in a moist environment, the electrical and optical properties of the reflective layer 3 are destroyed after relatively short operation of the optoelectronic semiconductor chip.

A means 6 which brings about a shielding of the reflective layer 3 against the electric field described above is now provided as a measure against the migration. Extraction of metal from the reflective layer 3 is thus inhibited or even prevented. In the present case, the means 6 comprises an electrically insulating layer 7, which is applied to chip sidewalls 11 of the semiconductor body 10. An electrically conductive material 5 is applied to that side of the insulating layer 7 which is remote from the semiconductor body 10, said material being electrically directly connected to the second contact location 2. That is to say that the electrically conductive material 5 is also at the second potential U2, in the same way as the second contact location 2 and the reflective layer 3. Preferably, the electrically conductive material extends between the underside 10*b* and the top side 10*a* of the semiconductor body 10 completely along the chip sidewalls 11.

That is to say that the chip sidewalls 11 are completely covered by the electrically conductive material 5.

The electrically conductive material 5 is a radiation-transmissive, conductive oxide, for example.

Transparent conductive oxides ("TCO" for short) are transparent, conductive materials, generally metal oxides such as, for example, zinc oxide, tin oxide, cadmium oxide, titanium oxide, indium oxide or indium tin oxide (ITO). Alongside binary metal-oxygen compounds such as, for example, ZnO, $SnO_2$ or $In_2O_3$, ternary metal-oxygen compounds such as, for example, $Zn_2SnO_4$, $CdSnO_3$, $ZnSnO_3$, $MgIn_2O_4$, $GaInO_3$, $Zn_2In_2O_5$ or $In_4Sn_3O_{12}$ or mixtures of different transparent conductive oxides also belong to the group of the TCOs. Furthermore, the TCOs do not necessarily correspond to a stoichiometric composition and can also be p- or n-doped.

Other electrically conductive materials such as metals, for example, are also suitable for forming the electrically conductive material 5. TCO has the advantage, however, that light emerging at the chip sidewall 11 is not absorbed or is only slightly absorbed.

The electrically insulating layer 7, too, in the same way as the electrically conductive material 5, can be transmissive to the electromagnetic radiation generated in the active zone 9. In this way, therefore, the means 6 can be radiation-transmissive.

The electrically conductive material 5 shields the electric field between the first contact location 1 and the reflective layer 3 in such a way that migration of metal from the reflective layer 3 in the semiconductor body 10 is reduced in comparison with an optoelectronic semiconductor chip having no means 6. That is to say that the migration in the electric field on account of the potential difference between first potential U1 and second potential U2 is inhibited or even prevented. That is to say that the mechanism of ion migration in the electric field is prevented by virtue of the electric field being shielded around the critical locations of the semiconductor chip. This leads to a particularly cost-effective semiconductor body since a complex encapsulation of the reflective layer against migration of metal from the reflective layer can be omitted. Furthermore, the luminous area is enlarged compared with conventional optoelectronic semiconductor chips since fewer safety distances and alignment tolerances have to be complied with.

In the case of conventional optoelectronic semiconductor chips having a mirror containing a metal that tends toward migration, the mirror 3 is structured in such a way that it has a safety distance with respect to the chip sidewall 11. Said safety distance ensures that the metal remains packaged and, for example, is not uncovered during the production of the chip sidewall—for example by means of a mesa etch. The size of said safety distance is governed by the tolerances required during processing. That is to say that, for example, the alignment tolerance in the photolithography for producing the chip sidewalls 11 and/or the tolerances during the structuring of the chip sidewalls 11 predetermine(s) the size of the safety distance. Therefore, a safety distance of approximately 10 μm typically has to be complied with at each chip sidewall. This reduces the area with which contact is actually made, and hence the luminous area of the chip. Therefore, in the case of the semiconductor chip described here, the luminous area is enlarged compared with conventional optoelectronic semiconductor chips.

The increase in the luminous area leads to a lower current density and, at the same time, to a higher efficiency of the optoelectronic semiconductor chip.

The means 6, that is to say the electrically insulating layer 7 and also the electrically conductive material 5 shield the electric field between the reflective layer 3 and the first contact location 1.

The second exemplary embodiment—described in greater detail in conjunction with FIG. 2—of an optoelectronic semiconductor chip described here differs from the semiconductor chip described in conjunction with FIG. 1 in that the reflective layer 3 is not structured. In this case, therefore, a reflective layer 3 is applied to the underside 10b of the semiconductor body 10 over the whole area. This opens up the possibility that the optoelectronic semiconductor chip has to be structured solely from its top side 10a during fabrication. An alignment of structures at the underside 10b of the semiconductor body 10 with structures on the top side 10a—for example the site of the contact location—can therefore be obviated. In particular, by way of example, a projection 13 of the first contact location 1 onto the underside 10b of the semiconductor body 10 can be obviated.

In the exemplary embodiment described in conjunction with FIG. 2, a trench 8 is introduced into the semiconductor body 10 from the top side 10a. The trench 8 extends from the top side 10a to the underside 10b and penetrates through the active zone 9. Furthermore, the trench completely interrupts the semiconductor body in the present case. That is to say that a for example ring-shaped trench is produced in the semiconductor body 10 around the first contact location 1, said trench penetrating through the semiconductor body 10.

The semiconductor body 10 is provided with an electrically insulating material 7 in the region of the trench 8, that is to say at the chip sidewalls formed by the trench 8 and also at the top side 10a of the semiconductor body 10. In this way it is ensured that no or hardly any electromagnetic radiation is generated in the region below the contact location 1.

The current spreading from the first contact location 1 via the top side 10a of the semiconductor body 10 can be effected by means of a transparent conductive oxide 15 (TCO), for example. Such a TCO material can be used in the exemplary embodiment in FIG. 1, too, for the current spreading from the contact location 1 via the top side 10a of the semiconductor body 10.

The invention is not restricted to the exemplary embodiments by the description on the basis thereof. Rather, the invention encompasses any novel feature and also any combination of features, which in particular includes any combination of features in the patent claims, even if this feature or this combination itself is not explicitly specified in the patent claims or exemplary embodiments.

The invention claimed is:

1. An optoelectronic semiconductor chip comprising:
   a semiconductor body, having a top side with a first contact location and an underside with a second contact location;
   a reflective layer in direct contact with the semiconductor body and directly electrically conductively connected to the second contact location, wherein the reflective layer contains a metal that tends toward migration;
   the semiconductor chip having a chip sidewall extending between the top side and the underside of the semiconductor body; and
   an electrically conductive material arranged at the chip sidewall, the electrically conductive material being directly electrically conductively connected to the second contact location and the reflective layer;
   wherein said electrically conductive material comprises a radiation-transmissive, conductive oxide, and
   wherein the radiation-transmissive conductive oxide forming the electrically conductive material arranged at the chip sidewall is in direct contact with the reflective layer.

2. The optoelectronic semiconductor chip as claimed in claim 1, wherein a trench is structured into the semiconductor body around the first contact location from the top side of the semiconductor body.

3. The optoelectronic semiconductor chip as claimed in claim 2, wherein the trench severs an active zone of the optoelectronic semiconductor chip.

4. The optoelectronic semiconductor chip as claimed in claim 3, wherein the trench extends to the reflective layer.

5. The optoelectronic semiconductor chip as claimed in claim 1, wherein an electrically insulating material is arranged between the chip sidewall and the electrically conductive material, the electrically insulating material preventing contact from being made with the semiconductor body by the electrically conductive material.

6. The optoelectronic semiconductor chip as claimed in claim 1, wherein, during operation of the optoelectronic semiconductor chip:
   the first contact location is at a first electrical potential;
   the second contact location, the reflective layer and the electrically conductive material are at a common second electrical potential; and the first electrical potential is different than the common second electrical potential.

7. The optoelectronic semiconductor chip as claimed in claim 1, wherein the reflective layer contains silver or consists of silver.

8. The optoelectronic semiconductor chip as claimed in claim 1, wherein the reflective layer is structured such that the underside of the semiconductor body is free of the reflective layer in a region of a projection of the first contact location onto the underside.

9. The optoelectronic semiconductor chip as claimed in claim 1, wherein the optoelectronic semiconductor chip comprises a thin-film semiconductor chip.

10. The optoelectronic semiconductor chip as claimed in claim 9, wherein a growth substrate is removed from the semiconductor body and the semiconductor body is fixed on a carrier by the second contact layer.

11. The optoelectronic semiconductor chip as claimed in claim 1,
wherein a means which, during operation of the optoelectronic semiconductor chip, forms an electric field that counteracts the migration of the metal is provided at the optoelectronic semiconductor chip; and
wherein the means is formed with the electrically conductive material which extends between the first and second contact locations.

12. The optoelectronic semiconductor chip as claimed in claim 1, wherein an underside of the reflective layer which faces away from the semiconductor body is free of the radiation-transmissive conductive oxide.

13. The optoelectronic semiconductor chip as claimed in claim 1, wherein only the top surface of the reflective layer which faces the semiconductor body is in contact with the electrically conductive material comprising the radiation-transmissive conductive oxide.

14. The optoelectronic semiconductor chip as claimed in claim 1, wherein the reflective layer projects beyond the chip sidewalls.

* * * * *